United States Patent
Takata

(10) Patent No.: US 11,405,018 B2
(45) Date of Patent: Aug. 2, 2022

(54) FILTER AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/928,025

(22) Filed: Jul. 14, 2020

(65) Prior Publication Data

US 2021/0028764 A1 Jan. 28, 2021

(30) Foreign Application Priority Data

Jul. 22, 2019 (JP) .............................. JP2019-134619
May 25, 2020 (JP) .............................. JP2020-090852

(51) Int. Cl.
| | |
|---|---|
| *H03H 9/46* | (2006.01) |
| *H03H 9/54* | (2006.01) |
| *H04B 1/00* | (2006.01) |
| *H03H 9/02* | (2006.01) |
| *H03H 9/205* | (2006.01) |

(52) U.S. Cl.
CPC ........ *H03H 9/542* (2013.01); *H03H 9/02228* (2013.01); *H03H 9/205* (2013.01); *H03H 9/46* (2013.01); *H04B 1/0057* (2013.01)

(58) Field of Classification Search
CPC .... H03H 9/542; H03H 9/02228; H03H 9/205; H04B 1/0057
See application file for complete search history.

(56) References Cited

U.S. PATENT DOCUMENTS

| | | | | |
|---|---|---|---|---|
| 9,184,728 B2* | 11/2015 | Takamine | ............ | H03H 9/0028 |
| 9,998,098 B2* | 6/2018 | Takata | ................ | H03H 9/6483 |
| 10,270,426 B2* | 4/2019 | Takamine | .............. | H03H 9/725 |
| 2017/0117873 A1 | 4/2017 | Takata | | |

FOREIGN PATENT DOCUMENTS

JP          2017-085262 A      5/2017

* cited by examiner

*Primary Examiner* — Dinh T Le
(74) *Attorney, Agent, or Firm* — Keating & Bennett, LLP

(57) ABSTRACT

A filter includes a ladder filter including a first parallel arm resonator and a second parallel arm resonator, a longitudinally coupled resonator filter electrically connected in series to the ladder filter, a first ground terminal electrically connected to the first parallel arm resonator, a second ground terminal electrically connected to the second parallel arm resonator, a third ground terminal electrically connected to the longitudinally coupled resonator filter, a third signal path electrically connected to a first node on a first signal path electrically connecting the second parallel arm resonator to the second ground terminal and a second node on a second signal path electrically connecting the longitudinally coupled resonator filter to the third ground terminal, and an inductor electrically connected between the first node on the first signal path and the second ground terminal or between the second node on the second signal path and the third ground terminal.

12 Claims, 5 Drawing Sheets

FIG. 10  Tx-Rx ISOLATION CHARACTERISTICS

FILTER AND MULTIPLEXER

CROSS REFERENCE TO RELATED APPLICATIONS

This application claims the benefit of priority to Japanese Patent Application No. 2020-090852 filed on May 25, 2020 and Japanese Patent Application No. 2019-134619 filed on Jul. 22, 2019. The entire contents of these applications are hereby incorporated herein by reference.

BACKGROUND OF THE INVENTION

1. Field of the Invention

The present invention relates to a filter and a multiplexer.

2. Description of the Related Art

Band pass filters have hitherto been known (for example, Japanese Unexamined Patent Application Publication No. 2017-85262). A typical band pass filter is provided on a piezoelectric substrate. In the band pass filter, a ladder filter including a first parallel arm resonator and a second parallel arm resonator is connected in series to a longitudinally coupled resonator filter.

The filter disclosed in Japanese Unexamined Patent Application Publication No. 2017-85262 has a first ground terminal connected to the first parallel arm resonator, a second ground terminal connected to the second parallel arm resonator, and a third ground terminal connected to the longitudinally coupled resonator filter.

The first ground terminal is not connected to the second ground terminal on the piezoelectric substrate, and the second ground terminal is connected to the third ground terminal on the piezoelectric substrate. In other words, the first ground terminal is separated from the second ground terminal and the second ground terminal is integrated with the third ground terminal on the piezoelectric substrate.

With the filter disclosed in Japanese Unexamined Patent Application Publication No. 2017-85262, since separating the first ground terminal from the second ground terminal reduces the influence of parasitic inductance, attenuation characteristics at the low pass end of a pass band are capable of being steepened. In addition, since integrating the second ground terminal with the third ground terminal stabilizes ground potential of the longitudinally coupled resonator filter, the attenuation outside the pass band (for example, isolation when the filter composes a multiplexer with another filter) is capable of being increased.

However, there are cases in which sufficient attenuation is not achieved outside the pass band in the filters in related art.

SUMMARY OF THE INVENTION

Preferred embodiments of the present invention provide band pass filters in each of which a ladder filter is electrically connected in series to a longitudinally coupled resonator filter and which has excellent attenuation outside the pass band.

A filter according to a preferred embodiment of the present invention includes a ladder filter including a first parallel arm resonator and a second parallel arm resonator; a longitudinally coupled resonator filter that is electrically connected in series to the ladder filter; a first ground terminal that is electrically connected to the first parallel arm resonator; a second ground terminal that is separate from the first ground terminal and that is electrically connected to the second parallel arm resonator; a third ground terminal that is separate from the first ground terminal and that is electrically connected to the longitudinally coupled resonator filter; a third signal path that is electrically connected to a first node on a first signal path electrically connecting the second parallel arm resonator to the second ground terminal and a second node on a second signal path electrically connecting the longitudinally coupled resonator filter to the third ground terminal; and an inductor that is electrically connected between the first node on the first signal path and the second ground terminal or between the second node on the second signal path and the third ground terminal.

A multiplexer according to another preferred embodiment of the present invention includes a first filter and a second filter. One end of the first filter is electrically connected to one end of the second filter. The first filter is the filter described above, and the center frequency of the pass band of the first filter is higher than the center frequency of the pass band of the second filter.

With the filter described above, since the first ground terminal is separate from the second ground terminal and the third ground terminal, the attenuation characteristics are able to be steepened at the low pass end of the pass band, as in the filter in the related art.

In addition, the second parallel arm resonator is electrically connected to the longitudinally coupled resonator filter with the inductor interposed between the second parallel arm resonator and the longitudinally coupled resonator filter at the ground side. The inductor is an equivalent representation of the inductance component of the signal path electrically connecting the first node to the second node and may be small to an extent that the inductance is able to be substantially ignored.

Accordingly, series resonance occurs due to the combined capacitance resulting from a combination of the capacitance of the second parallel arm resonator and the capacitance of the longitudinally coupled resonator filter and the second inductor. An attenuation pole caused by the series resonance is shifted toward a low frequency side, compared with a case in which the second inductor is not provided. As a result, the attenuation in a target frequency band at the low frequency side outside the pass band is significantly improved.

Since the second inductor is commonly electrically connected to the second parallel arm resonator and the longitudinally coupled resonator filter, the size of the apparatus is able to be significantly reduced, compared with a case in which individual inductors are electrically connected to the second parallel arm resonator and the longitudinally coupled resonator filter.

In addition, since the second inductor is electrically connected between the first node and the second ground terminal, ground potential of the longitudinally coupled resonator filter is less likely to be unstable, compared with a case in which the second inductor is electrically connected between the second node and the third ground terminal. As a result, the attenuation in the target frequency band is significantly improved.

With the filter described above, the attenuation in the target frequency band at the low frequency side outside the pass band is significantly improved, in addition to the steep attenuation characteristics at the low pass end of the pass band. Accordingly, by combining the filter described above with another filter the center frequency of the pass band of which is lower than that of the filter described above, a multiplexer with excellent inter-band isolation is able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a graph showing an example of isolation characteristics between terminals of the multiplexers.

DETAILED DESCRIPTION OF THE PREFERRED EMBODIMENTS

Preferred embodiments of the present invention will herein be described using preferred embodiments with reference to the drawings. All of the preferred embodiments described below provide comprehensive or specific examples. Numerical values, shapes, materials, components, the location and arrangement of the components, the connection mode of the components, and so on, which are described and shown in the preferred embodiments described below, are only examples and are not intended to limit the present invention. In the preferred embodiments described below, "connection" includes not only direct connection with a wiring conductor but also electrical connection via another circuit element.

A multiplexer according to a preferred embodiment of the present invention will now be described, providing a duplexer including a transmission filter and a reception filter as an example.

Figure 1:
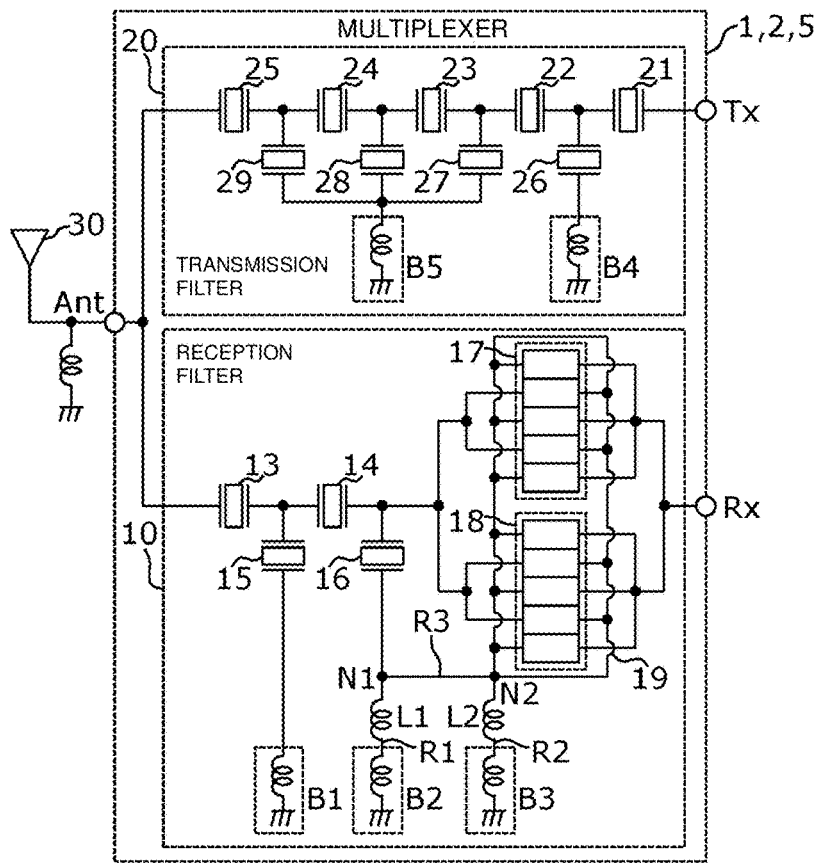
FIG. 1 is a circuit diagram showing an example of a multiplexer according to a preferred embodiment of the present invention.

FIG. 1 is a circuit diagram showing an example of a multiplexer 1 according to the present preferred embodiment. Referring to FIG. 1, the multiplexer 1 includes terminals Ant, Tx, and Rx, a reception filter 10, and a transmission filter 20. The terminal Ant is connected to an antenna element 30.

The reception filter 10 is a filter circuit using a desired reception frequency band as a pass band and is connected to the terminal Ant and the terminal Rx. One end and the other end of the reception filter 10 may be directly connected to the terminal Ant and the terminal Rx, respectively, or may be connected to the terminal Ant and the terminal Rx, respectively, via other circuit elements (not shown).

In the reception filter 10, series arm resonators 13 and 14 and parallel arm resonators 15 and 16 define a ladder resonator filter. In addition, resonator groups 17 and 18 that are connected in parallel to each other define a longitudinally coupled resonator filter. Each of the resonator groups 17 and 18 includes five IDT electrodes that are adjacent to or in a vicinity of one another in the propagation direction of acoustic waves. The ladder resonator filter is connected in series to the longitudinally coupled resonator filter.

One end of the parallel arm resonator 15 is connected to ground B1. A node N1 on a signal path R1 connecting the parallel arm resonator 16 to ground B2 is connected to a node N2 on a signal path R2 connecting the resonator groups 17 and 18 to ground B3 with a signal path R3.

An inductor L1 is provided between the node N1 on the signal path R1 and the ground B1, and an inductor L2 is provided between the node N2 on the signal path R2 and the ground B3. The ends at the ground side of all the IDT electrodes included in the resonator groups 17 and 18 are connected to the ground B3 with the inductor L2 interposed between the ends at the ground side of all the IDT electrodes included in the resonator groups 17 and 18 are and the ground B3. The grounds B1, B2, and B3 are external connection terminals and have parasitic inductance components.

The inductors L1 and L2 may be equivalent inductance components of the corresponding lines or may be inductance components of discrete components. The inductance of the inductor L1 is higher than the inductance of the inductor L2. The inductance of the inductor L2 may be low to an extent that the inductance is able to be substantially ignored. Although the other lines also have inductance components, the other lines are not shown in FIG. 1 because the other lines are not main portions of the present preferred embodiment.

The transmission filter 20 is a ladder resonator filter including series arm resonators 21, 22, 23, 24, and 25 and parallel arm resonators 26, 27, 28, and 29. The end at the ground side of the parallel arm resonator 26 is connected to ground B4, and the ends at the ground side of the parallel arm resonators 27, 28, and 29 are connected to ground B5. The grounds B4 and B5 are external connection terminals and have parasitic inductance components.

The basic structure of the IDT electrode will now be described.

Figure 2A:
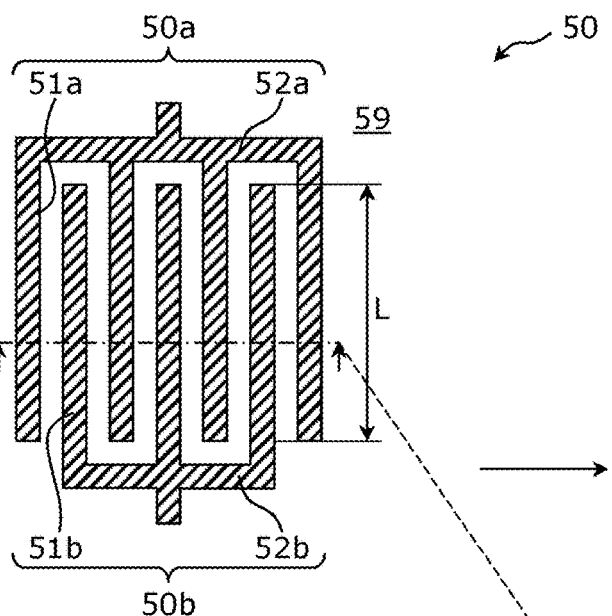
FIGS. 2A and 2B are a plan view and a cross-sectional view, respectively, showing an example of the basic structure of an interdigital transducer (IDT) electrode.
Figure 2B:
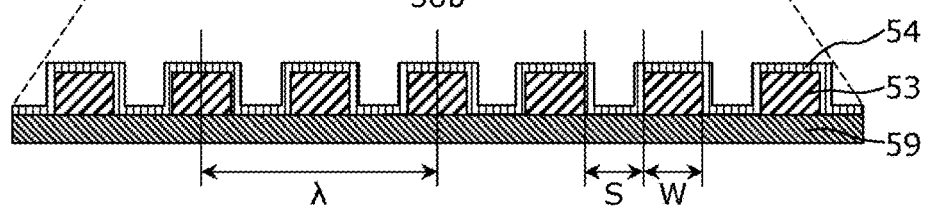

FIGS. 2A and 2B are a plan view and a cross-sectional view, respectively, showing an example of the basic structure of an IDT electrode 50. The structure of the IDT electrode 50 shown in FIGS. 2A and 2B applies to each IDT electrode defining the series arm resonators 13 and 14, the parallel arm resonators 15 and 16, and the resonator groups 17 and 18 in the reception filter 10. The example in FIGS. 2A and 2B is for description of the basic structure of the IDT electrode 50 and the number of electrode fingers defining the IDT electrode 50, the lengths thereof, and so on are not limited to those in the example in FIGS. 2A and 2B.

The IDT electrode 50 includes a pair of interdigital electrodes 50a and 50b that are opposed to each other. The interdigital electrode 50a includes multiple electrode fingers 51a that are parallel or substantially parallel to each other and a busbar electrode 52a with which the multiple electrode fingers 51a are connected. The interdigital electrode 50b includes multiple electrode fingers 51b that are parallel or substantially parallel to each other and a busbar electrode 52b with which the multiple electrode fingers 51b are connected. The electrode fingers 51a and 51b extend in a direction orthogonal or substantially orthogonal to the X-axis direction, which is the propagation direction of the acoustic waves, and are interdigitated with each other.

Parameters that defines the shape and the size of the IDT electrode 50 are hereinafter referred to as electrode parameters. The electrode parameters are exemplified by a waveform λ, which is a repetition period in the X-axis direction of the electrode fingers 51a or the electrode fingers 51b, an intersecting width L, which is the length by which the electrode fingers 51a and 51b are overlapped viewed from the X-axis direction, a line width W of the electrode fingers 51a and 51b, and a space width S between the electrode fingers 51a and 51b that are adjacent to each other.

The number of pairs, which is half of the number of the electrode fingers of the electrode fingers 51a and 51b, a pitch (W+S), which is a repetition period of the electrode fingers of the electrode fingers 51a and 51b, and a duty ratio W/(W+S), which is the ratio of the line width with respect to the pitch are also examples of the electrode parameters.

The electrode fingers 51a and 51b and the busbar electrodes 52a and 52b include an electrode layer 53 provided on a piezoelectric substrate 59.

For example, the electrode layer 53 may include metal, such as copper or aluminum, or alloy of them and the piezoelectric substrate 59 may include a piezoelectric layer including lithium tantalate, lithium niobate, or the like. The electrode layer 53 may be provided on the piezoelectric substrate 59 with a contact layer (not shown) interposed between the electrode layer 53 and the piezoelectric substrate 59. The electrode layer 53 may be covered with a protective layer 54.

The piezoelectric substrate 59 may include one piezoelectric layer or may be a multilayer substrate at least partially having piezoelectricity. The multilayer substrate at least partially having piezoelectricity may be a multilayer body including a support substrate, a high-acoustic-velocity film that is provided on the support substrate and that has a propagating bulk-wave acoustic velocity higher than an acoustic-wave velocity propagating on a piezoelectric thin film, a low-acoustic-velocity film that is laminated on the high-acoustic-velocity film and that has a propagating bulk-wave acoustic velocity lower than a bulk-wave velocity propagating on the piezoelectric thin film, and the piezoelectric thin film laminated on the low-acoustic-velocity film. The support substrate may be a high-acoustic-velocity support substrate, for example, a silicon substrate, defining and functioning as both the high-acoustic-velocity film and the support substrate.

An example of the location and arrangement of the electrodes of the multiplexer 1 provided on the piezoelectric substrate will now be described.

Figure 3:
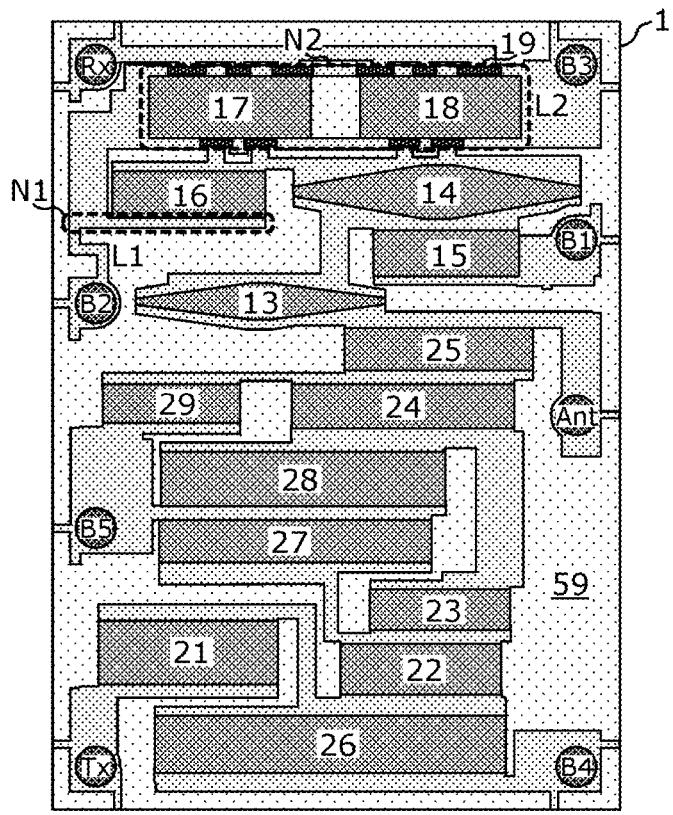
FIG. 3 is a plan view showing an example of the location and arrangement of electrodes on a piezoelectric substrate of a multiplexer according to a preferred embodiment of the present invention.

FIG. 3 is a plan view showing an example of the location and arrangement of the electrodes on the piezoelectric substrate 59 of the multiplexer 1. Referring to FIG. 3, each resonator in the multiplexer 1 includes the IDT electrodes provided in an area to which the corresponding number on the piezoelectric substrate 59 is added. The terminals Ant, Tx, Rx, B1, B2, B3, B4, and B5, which are the electrode structure for external connection, the lines with which the resonators are connected, and the electrodes defining and functioning as the lines with which the resonators are connected to the terminals are provided on the piezoelectric substrate 59.

The busbar electrodes at the ground side of the IDT electrodes of the resonator groups 17 and 18 are connected to the ground terminal B3 with solid lines 19. The ground terminal B1 is separate from the ground terminals B2 and B3.

The inductors L1 and L2 are the inductance components of the corresponding lines. Specifically, the inductor L1 is the inductance component of the line with which the node N1 is connected to the ground terminal B2. The inductor L2 is the inductance component of the line with which the node N2 is connected to the ground terminal B3.

The inductance component of the inductor L1 is larger than the inductance component of the inductor L2. Specifically, since the line with which the node N1 is connected to the ground terminal B2 is defined by a line that is deliberately routed to have a meandering shape, the inductor L1 has the large inductance component. In contrast, since the line with which the node N2 is connected to the ground terminal B3 is defined by a line having a planar or substantially planar pattern that does not have a meandering shape, the inductance component of the inductor L2 is small to an extent that the inductance is able to be ignored.

The electrode parameters of the parallel arm resonators 15 and 16 are set as follows, as an example. The number of pairs of the electrode fingers of the parallel arm resonators 15 and 16 are preferably 63 pairs and 67 pairs, respectively, and the intersecting widths thereof are preferably about 71 μm and about 91 μm, respectively.

The electrostatic capacitance of the resonator is mainly proportional to the product of the number of pairs of the electrode fingers and the intersecting width. The electrostatic capacitances of the parallel arm resonators 15 and 16 are about 2.1 pF and about 2.8 pF, respectively, and the electrostatic capacitance of the parallel arm resonator 16 is higher than the electrostatic capacitance of the parallel arm resonator 15.

With the multiplexer 1 having the features components, and elements described above, since the ground terminal B1 is separate from the ground terminals B2 and B3, attenuation characteristics are able to be steepened at the low pass end of the pass band, as in the filter in the related art.

In addition, the parallel arm resonator 16 is connected to the resonator groups 17 and 18 via the signal path R3 at the ground side.

Accordingly, series resonance occurs due to the combined capacitance resulting from combination of the capacitance of the parallel arm resonator 16 and the capacitances of the resonator groups 17 and 18 and the inductor L1. An attenuation pole caused by the series resonance is shifted toward a low frequency side, compared with a case in which the inductor L1 is not provided. As a result, the attenuation in a transmission frequency band at the low frequency side outside the pass band is significantly improved.

Since the inductor L1 is commonly connected to the parallel arm resonator 16 and the resonator groups 17 and 18, the size of the apparatus is able to be significantly reduced, compared with a case in which individual inductors are connected to the parallel arm resonator 16 and the resonator groups 17 and 18.

In addition, since the attenuation pole is shifted by the inductor L1 connected between the node N1 and the ground terminal B2, it is not necessary to increase the inductance of the inductor L2 connected between the node N2 and the ground terminal B3. Since the inductance of the inductor L2 is not high, the ground potential of the resonator groups 17 and 18 is less likely to be unstable. As a result, the attenuation in the transmission frequency band is significantly improved.

Furthermore, since the ends at the ground side of all the IDT electrodes of the resonator groups 17 and 18 are integrated, the ground potential of the resonator groups 17 and 18 are further stabilized and the parasitic inductance components are significantly reduced. Accordingly, the advantageous effect of significantly improving the attenuation in the transmission frequency band is increased.

Furthermore, the parallel arm resonator 16 has the highest electrostatic capacitance of the electrostatic capacitances of the parallel arm resonators 15 and 16. Accordingly, the combined capacitance resulting from combination of the capacitance of the parallel arm resonator 16 and the capacitances of the resonator groups 17 and 18 is increased and the inductance component that shifts the attenuation pole toward the low frequency side is able to be decreased. As a result, this contributes to the reduction of the size of the chip.

With the reception filter 10, the attenuation in the transmission frequency band is significantly improved, in addition to the steep attenuation characteristics at the low pass end of the pass band. Accordingly, by combining the reception filter 10 with the transmission filter 20, the multiplexer 1 with excellent isolation between transmission and reception is able to be provided.

The advantages of the multiplexer 1 described above and a modification of a preferred embodiment of the present invention will now be described, in contrast with those of comparative examples.

Figure 4:
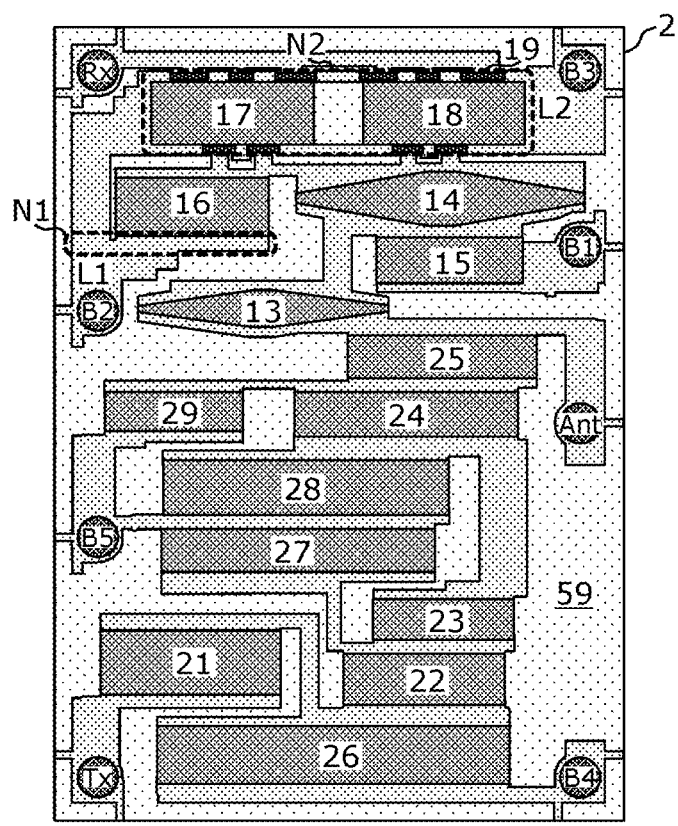
FIG. 4 is a plan view showing an example of the location and arrangement of electrodes on a piezoelectric of a multiplexer according to a first comparative example.

FIG. 4 is a plan view showing an example of the location and arrangement of the electrodes on the piezoelectric substrate 59 of a multiplexer 2 according to a first comparative example.

The multiplexer 2 has the same or similar configuration as that of the multiplexer 1 and differs from the multiplexer 1 in that the inductor L1 has the smaller inductance component.

As shown in FIG. 4, since the line with which the node N1 is connected to the ground terminal B2 is defined by an electrode having a planar or substantially planar pattern in the multiplexer 2, the inductance component of the inductor L1 is the same or substantially the same as the inductance of the inductor L2 and is small to an extent that the inductance is able to be ignored.

Figure 5:
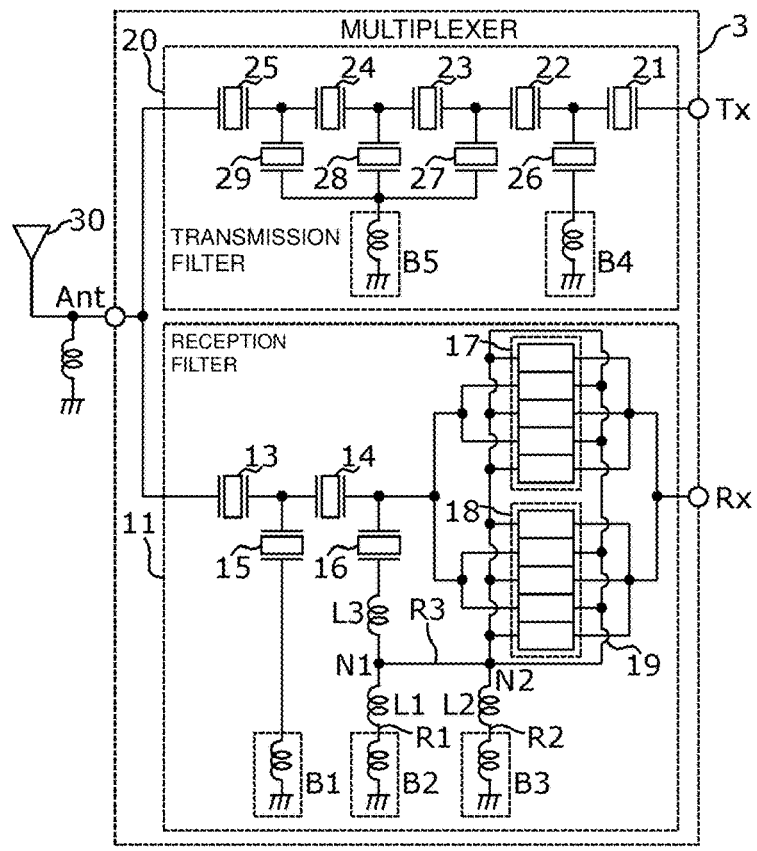
FIG. 5 is a circuit diagram showing an example of a multiplexer according to a second comparative example.

FIG. 5 is a circuit diagram showing an example of a multiplexer 3 according to a second comparative example.

Figure 6:
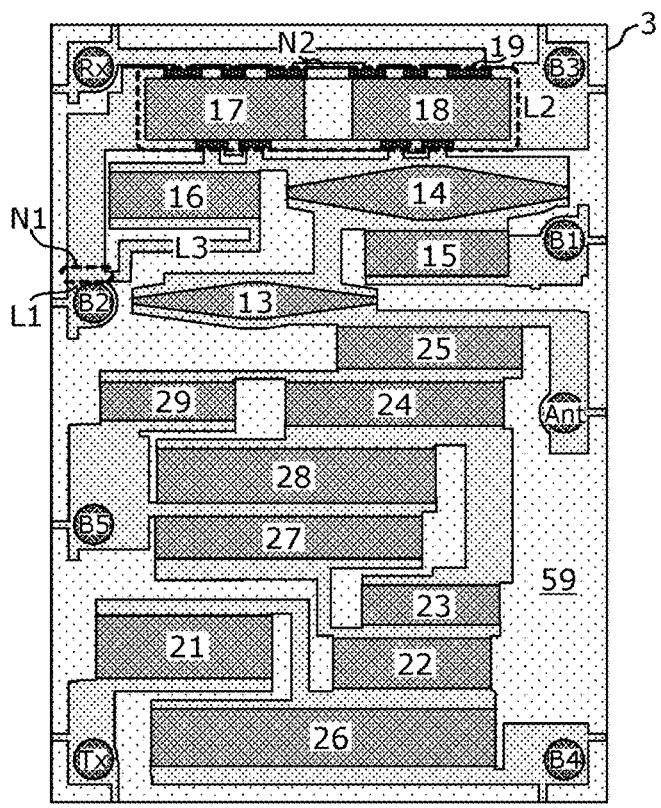
FIG. 6 is a plan view showing an example of the location and arrangement of the electrodes on the piezoelectric substrate of the multiplexer according to the second comparative example.

FIG. 6 is a plan view showing an example of the location and arrangement of the electrodes on the piezoelectric substrate 59 of the multiplexer 3.

The multiplexer 3 differs from the multiplexer 1 in that an inductor L3 is provided between the parallel arm resonator 16 and the node N1.

As shown in FIG. 5 and FIG. 6, the inductor L3, which is a line that is deliberately routed to have a meandering shape, is provided between the parallel arm resonator 16 and the node N1 in a reception filter 11 in the multiplexer 3. Since the length of the line corresponding to the inductor L1 is substantially zero and the line corresponding to the inductor L2 is defined by an electrode having a planar or substantially planar pattern, the inductance components of the inductors L1 and L2 are small to an extent that the inductances are able to be ignored.

Figure 7:
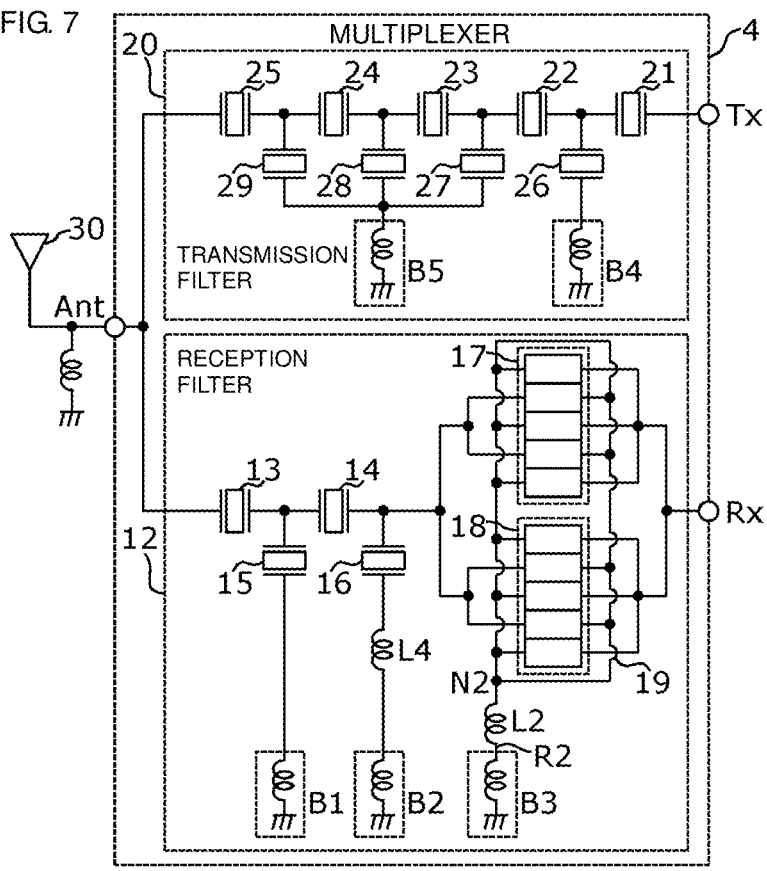
FIG. 7 is a circuit diagram showing an example of a multiplexer according to a third comparative example.

FIG. 7 is a circuit diagram showing an example of a multiplexer 4 according to a third comparative example.

Figure 8:
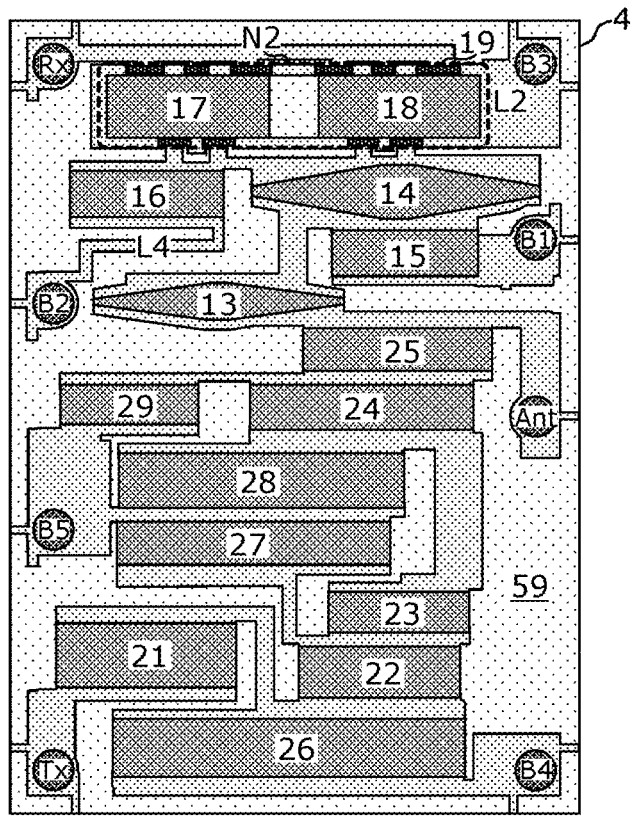
FIG. 8 is a plan view showing an example of the location and arrangement of the electrodes on the piezoelectric substrate of the multiplexer according to the third comparative example.

FIG. 8 is a plan view showing an example of the location and arrangement of the electrodes on the piezoelectric substrate 59 of the multiplexer 4.

The multiplexer 4 differs from the multiplexer 1 in that the multiplexer 4 includes no signal path with which the node N1 is connected to the node N2.

As shown in FIG. 7 and FIG. 8, all the ground terminals B1, B2, and B3 are separately provided in a reception filter 12 in the multiplexer 4. In addition, an inductor L4, which is a line that is deliberately routed to have a meandering shape, is provided between the parallel arm resonator 16 and the ground terminal B2.

Figure 9:
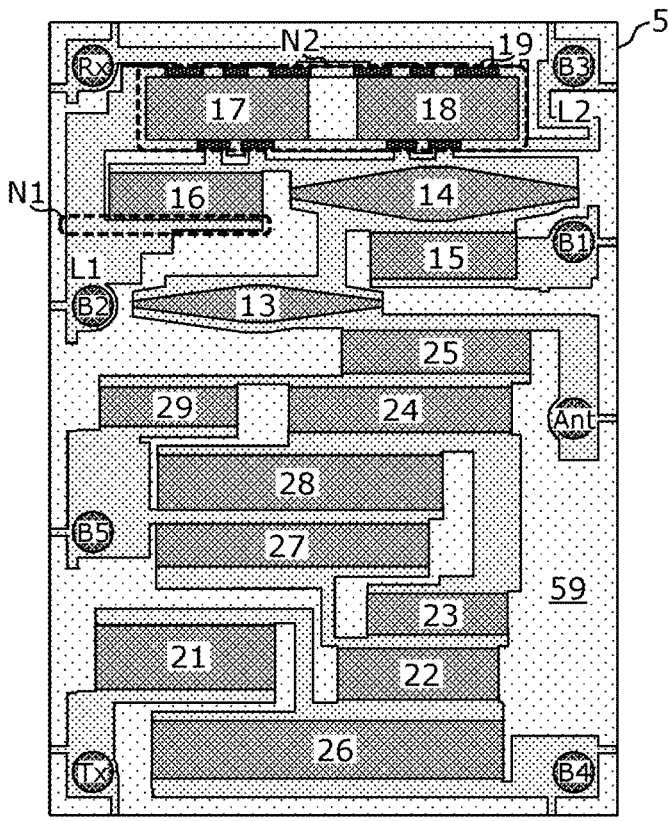
FIG. 9 is a plan view showing an example of the location and arrangement of the electrodes on the piezoelectric substrate of a multiplexer according to a modification of a preferred embodiment of the present invention.
Figure 9:
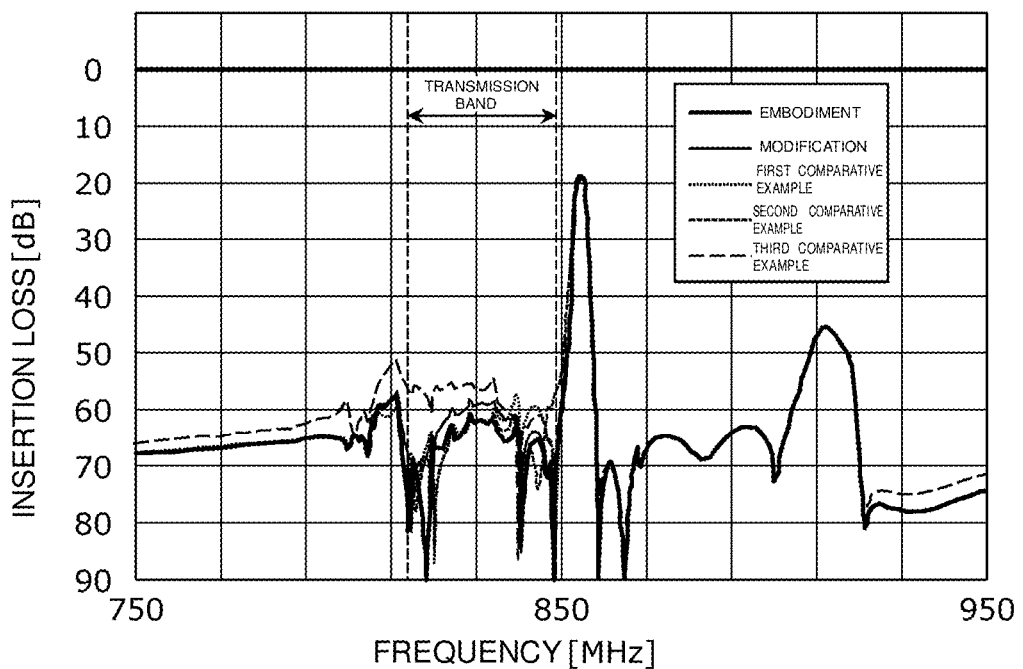

FIG. 9 is a plan view showing an example of the location and arrangement of the electrodes on the piezoelectric substrate 59 of a multiplexer 5 according to a modification.

The multiplexer 5 has the same or similar configuration as that of the multiplexer 1 in FIG. 1 and differs from the multiplexer 1 in FIG. 1 in that the inductance component of the inductor L1 is decreased and the inductance component of the inductor L2 is increased.

As shown in FIG. 9, since the line between the node N2 and the ground terminal B3 is defined by a line that is deliberately routed a meandering shape in the multiplexer 5, the inductor L2 has the large inductance component. In addition, since the line with which the node N1 is connected to the ground terminal B2 is defined by an electrode having a planar or substantially planar pattern, the inductance component of the inductor L1 is small to an extent that the inductance is able to be ignored. Accordingly, the inductance component of the inductor L2 is larger than the inductance component of the inductor L1 in the multiplexer 5.

When the multiplexer 1 is the multiplexer according to an example of a preferred embodiment of the present invention, isolation characteristics between the terminal Tx→the terminal Rx were calculated for the multiplexer 1 according to the example, the multiplexer 2 according to the first comparative example, the multiplexer 3 according to the second comparative example, the multiplexer 4 according to the third comparative example, and the multiplexer 5 according to the modification. An up frequency band (not lower than about 814 MHz and not higher than about 849 MHz) of Band26 of Long Term Evolution (LTE) (registered trademark) was set as the pass band of the transmission filter 20 (hereinafter referred to as a transmission band) and a down frequency band (not lower than about 859 MHz and not higher than about 894 MHz) of Band26 of the LTE was set as the pass band of the reception filters 10, 11, and 12 (hereinafter referred to as a reception band).

FIG. 10 is a graph showing an example of the isolation characteristics between the terminal Tx→the terminal Rx of the multiplexers.

As shown in FIG. 10, the minimum values of insertion loss (the worst values of isolation) in the transmission band were about 60.7 dB in the example, about 58.6 dB in the modification, about 57.2 dB in the first comparative example, about 56.3 dB in the second comparative example, and about 53.8 dB in the third comparative example.

In the example, the node N1 is connected to the node N2 to shift the attenuation pole caused by the series resonance occurring due to the combined capacitance resulting from combination of the capacitance of the parallel arm resonator 16 and the capacitances of the resonator groups 17 and 18 and the inductor L1 from near the reception band to the low frequency side. Shifting the attenuation pole toward the low frequency side by the combined capacitance provides high isolation in the entire transmission band while decreasing the inductance component.

In the first comparative example, since the inductor L1 is defined by the electrode having a planar or substantially planar pattern and the inductance component of the inductor L1 is small to an extent that the inductance is able to be substantially ignored although the node N1 is connected to the node N2, the attenuation pole is not able to be sufficiently shifted toward the low frequency side. Accordingly, the isolation from a middle band to a high band (not lower than about 831.5 MHz and not higher than about 849 MHz) of the transmission band is degraded, compared with that in the example.

In the second comparative example, the inductor L3 is provided between the parallel arm resonator 16 and the node N1 and the attenuation pole caused by the series resonance of the parallel arm resonator 16 and the inductor L3 is shifted from near the reception band to the low frequency side to significantly improve the attenuation in the transmission band.

The inductance component is increased in the second comparative example, compared with that in the example, because the capacitances of the resonator groups 17 and 18 are not applied to shift the attenuation pole. Accordingly, the increase in the inductance component impedes the reduction of the size of the apparatus. In addition, since the steepness of the attenuation characteristics is degraded at the low pass end of the reception band, the isolation near the high pass end (about 849 MHz) of the transmission band is degraded.

In the third comparative example, the ground of the parallel arm resonator 16 is not integrated with the grounds of the resonator groups 17 and 18, the inductor L4 is provided between the parallel arm resonator 16 and the ground terminal B2, and the attenuation pole caused by the series resonance of the parallel arm resonator 16 and the inductor L4 is shifted from near the reception band to the low frequency side to significantly improve the attenuation in the transmission band.

Since the ends at the ground side of the resonator groups 17 and 18 are not connected to the ground terminal B2 in the third comparative example, the parasitic inductance component occurring at the grounds of the resonator groups 17 and 18 is increased. Although the attenuation in the transmission band is generally increased as the ground potential of the resonator groups 17 and 18 is more stable, the ground potential is less likely to be stable because of the large parasitic inductance component in the third comparative example. Accordingly, the isolation in the entire transmission band is degraded.

In the modification, the node N1 is connected to the node N2 to shift the attenuation pole caused by the series resonance occurring due to the combined capacitance resulting from combination of the capacitance of the parallel arm resonator 16 and the capacitances of the resonator groups 17 and 18 and the inductor L2 from near the reception band to the low frequency side. The attenuation pole is shifted toward the low frequency side by the combined capacitance, as in the example, to decrease the inductance component in the modification.

Since the attenuation pole is shifted toward the low frequency side by the inductor L2 connected between the node N2 and the ground terminal B3 in the modification, the parasitic inductance component occurring at the grounds of the resonator groups 17 and 18 is increased, compared with that in the example. Accordingly, the isolation near the middle band (about 831.5 MHz) of the transmission band is degraded, compared with that in the example.

In all the multiplexers 1, 2, 3, 4, and 5 according to the example, the first comparative example, the second comparative example, the third comparative example, and the modification, respectively, the ground terminal B1 is separate from the ground terminals B2 and B3. Integrating the ground terminal B1 with the ground terminals B2 and B3 also shifts the attenuation pole caused by the parallel arm resonator 15 toward the low frequency side to disadvantageously degrade the steepness of the attenuation characteristics at the low frequency side of the reception band. With the multiplexers 1, 2, 3, 4, and 5, degradation of the steepness of the attenuation characteristics at the low side of the reception band is able to be significantly reduced or prevented.

Although the filters and the multiplexers according to the preferred embodiments of the present invention are described above, the present invention is not limited to the individual preferred embodiments. Modifications provided by making various changes according to the knowledge of a person skilled in the art to the above preferred embodiments without departing from the spirit and scope of the present invention and modes built by combining components in different preferred embodiments may also be included the range of one or multiple aspects of the present invention.

For example, although the duplexer is exemplified in the above preferred embodiments, the present invention is not limited to the duplexer. For example, the present invention may apply to a diplexer, a triplexer, a quadplexer, and so on that performs demultiplexing and multiplexing of multiple signals in different frequency bands.

For example, although the example is described in the preferred embodiments in which the second parallel arm resonator is connected to the longitudinally coupled resonator filter via the inductor at the ground side and the inductor is the inductor L1 provided between the node N1 on the signal path R1 and the ground terminal B2, the preferred embodiments are not limited to this. The inductor may be the inductor L2 provided between the node N2 on the signal path R2 and the ground terminal B3. The attenuation outside the pass band is also able to be significantly increased with the inductor L2, similar to the inductor L1.

Preferred embodiments of the present invention are widely usable for communication devices, for example, a mobile phone, as the filter and the multiplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter comprising:
a ladder filter including a first parallel arm resonator and a second parallel arm resonator;
a longitudinally coupled resonator filter electrically connected in series to the ladder filter;
a first ground terminal electrically connected to the first parallel arm resonator;
a second ground terminal separate from the first ground terminal and electrically connected to the second parallel arm resonator;
a third ground terminal separate from the first ground terminal and electrically connected to the longitudinally coupled resonator filter;
a third signal path that is electrically connected to a first node on a first signal path electrically connecting the second parallel arm resonator to the second ground terminal and a second node on a second signal path electrically connecting the longitudinally coupled resonator filter to the third ground terminal;

first inductor electrically connected between the first node on the first signal path and the second ground terminal, and a second inductor electrically connected between the second node on the second signal path and the third ground terminal; wherein an inductance of the first inductor is higher than an inductance of the second inductor.

2. The filter according to claim 1, wherein the longitudinally coupled resonator filter includes a plurality of interdigital transducer electrodes that are adjacent to or in a vicinity of one another in a propagation direction of acoustic waves, and one end of each of the plurality of interdigital transducer electrodes is electrically connected to the third ground terminal.

3. The filter according to claim 1, wherein the second parallel arm resonator has a highest electrostatic capacitance of electrostatic capacitances of all the parallel arm resonators included in the ladder filter.

4. A multiplexer comprising:
a first filter and a second filter, one end of the first filter being electrically connected to one end of the second filter; wherein
the first filter is the filter according to claim 1; and
a center frequency of a pass band of the first filter is higher than a center frequency of the pass band of the second filter.

5. The multiplexer according to claim 4, wherein the first filter is a reception filter and the second filter is a transmission filter.

6. The filter according to claim 1, wherein a first series arm resonator is electrically connected between the first parallel arm resonator and an input terminal.

7. The filter according to claim 6, wherein the input terminal is electrically connected to an antenna.

8. The filter according to claim 1, wherein a second series arm resonator is electrically connected between the first parallel arm resonator and the second parallel arm resonator.

9. The filter according to claim 1, wherein
the first ground terminal is electrically connected to a first external terminal;
the second ground terminal is electrically connected to a second external terminal; and
the third ground terminal is electrically connected to a third external terminal.

10. The filter according to claim 1, wherein
the first inductor is defined by a line with a meandering shape; and
the second inductor is defined by a line with a planar or substantially planar shape.

11. The filter according to claim 2, wherein each of the plurality of interdigital transducer electrodes includes a plurality of electrode fingers that that are parallel or substantially parallel to each other and a bulbar electrode.

12. The filter according to claim 11, wherein the plurality of electrode fingers extend a direction orthogonal or substantially orthogonal to the propagation direction of the acoustic waves.

* * * * *